(12) United States Patent
Jung

(10) Patent No.: US 6,521,473 B1
(45) Date of Patent: Feb. 18, 2003

(54) METHOD OF FABRICATING A LIQUID CRYSTAL DISPLAY

(75) Inventor: Yun-Ho Jung, Seoul (KR)

(73) Assignee: LGPhilips LCD Co., Ltd., Seoul (KR)

( * ) Notice: Subject to any disclaimer, the term of this patent is extended or adjusted under 35 U.S.C. 154(b) by 200 days.

(21) Appl. No.: 09/697,300

(22) Filed: Oct. 27, 2000

(30) Foreign Application Priority Data

Oct. 29, 1999 (KR) .......................................... 1999-47533

(51) Int. Cl.[7] .......................... H01L 21/00; H01L 29/04
(52) U.S. Cl. .......................... 438/30; 438/150; 438/158; 438/164; 438/166; 257/45; 257/75; 117/43
(58) Field of Search .......................... 438/150, 30, 166, 438/149, 478, 479, 482, 486, 151, 487, 488, 489, 490; 117/43

(56) References Cited

U.S. PATENT DOCUMENTS

| | | | |
|---|---|---|---|
| 4,433,202 A | 2/1984 | Maruyama et al. | |
| 5,306,651 A | 4/1994 | Masumo et al. | |
| 5,432,122 A | 7/1995 | Chae | |
| 5,496,768 A | 3/1996 | Kudo | |
| 5,585,647 A | 12/1996 | Nakajima et al. | |
| 5,614,426 A | 3/1997 | Funada et al. | |
| 5,616,506 A | 4/1997 | Takemura | |
| 5,696,388 A | 12/1997 | Funada et al. | |
| 5,767,003 A | 6/1998 | Noguchi | |
| 5,817,548 A | 10/1998 | Noguchi et al. | |
| 5,858,807 A | 1/1999 | Kawamura | |
| 5,923,997 A | 7/1999 | Mitanaga et al. | |
| 5,930,608 A | 7/1999 | Yamazaki et al. | |
| 6,001,714 A | 12/1999 | Nakajima et al. | |
| 6,072,550 A | 6/2000 | Kim | |
| 6,177,301 B1 * | 1/2001 | Jung | 438/150 |
| 6,300,175 B1 * | 10/2001 | Moon | 438/158 |
| 6,322,625 B2 * | 11/2001 | Im | 117/43 |
| 6,326,286 B1 * | 12/2001 | Park et al. | 438/478 |

FOREIGN PATENT DOCUMENTS

| | | |
|---|---|---|
| EP | 0141506 A2 | 5/1985 |
| EP | 0178447 A2 | 4/1986 |
| EP | 0456199 A2 | 11/1991 |
| JP | 07099314 A1 | 4/1995 |
| JP | 9-260684 A1 | 10/1997 |
| WO | WO-97/45827 A1 | 12/1997 |

OTHER PUBLICATIONS

M.A. Crowder et al., "Low–Temperature Single–Crystal Si TFTs Fabricated on Si Films Processed Via Sequential Lateral Solidification," Submitted to IEEE Electron Device Letters, Sep. 1997, pp. 1–3.

(List continued on next page.)

Primary Examiner—Matthew Smith
Assistant Examiner—Belur Keshavan
(74) Attorney, Agent, or Firm—McKenna Long & Aldridge LLP

(57) ABSTRACT

The present invention relates to a method of fabricating a liquid crystal display panel that involves patterning a silicon film crystallized by sequential lateral solidification. The method comprises the steps of preparing a silicon film, crystallizing the silicon film by growing silicon grains on a slant with respect to a horizontal direction of the silicon film, and forming a driver and a pixel part using the crystallized silicon film wherein the driver and pixel part comprise devices having channels arranged in horizontal and perpendicular directions relative to the silicon film. The crystallized silicon film has uniform grain boundaries in the channels of the devices, thereby improving the products by providing uniform electrical characteristics of devices that comprise a driver and a pixel part of an LCD panel.

14 Claims, 12 Drawing Sheets

OTHER PUBLICATIONS

James S. Im et al., "Controlled Super–Lateral Growth of Si Films For Microstructural Manipulation and Optimization," Physics Status Solid, pp. 1–7 w/8 pages of figures, Feb. 22, 1998.

James S. Im et al., "Crystalline Si Films for Integrated Active–Matrix Liquid–Crystal Displays," MRS Bulletin, vol. XXI, No. 3, Mar. 1996, pp. 39–48.

James S. Im et al., "Single–Crystal Si Films For Thin–Film Transistor Devices," Appl. Phys. Lett., vol. 70 (25), Jun. 23, 1997, pp. 3434–3436.

J.P. Leonard et al., "The Effect of Film Thickness and Pulse Duration Variation in Excimer Laser Crystallization of Thin Si Films," Mat. Res. Soc. Symp. Proc., vol. 452, pp. 947–952.

James W. Mayer, "Laser Annealing of Semiconductors," (Academic Press, New York, 1982), pp. 45–46.

Robert S. Sposili et al., "Sequential Lateral Solidification of Thin Films on $SiO_2$," Appl. Phys. Lett., vol. 69 (19), Nov. 4, 1996, pp. 2864–2866.

Robert S. Sposili et al., "Single–Crystal Si Films Via a Low–Substrate–Temperature Excimer–Laser Crystallization Method," Mat. Res. Soc. Symp. Proc., vol. 452, 1997, pp. 953–958.

Robert S. Sposili et al., "Single–Crystal Silicon Films Via a Low–Substrate–Temperature Excimer–Laser Crystallization Method," MRS Abstract 1996 Fall Meeting, submitted to Symposium Q: Advances in Microcrystalline and Nanocrystalline Semiconductors, 1996.

* cited by examiner

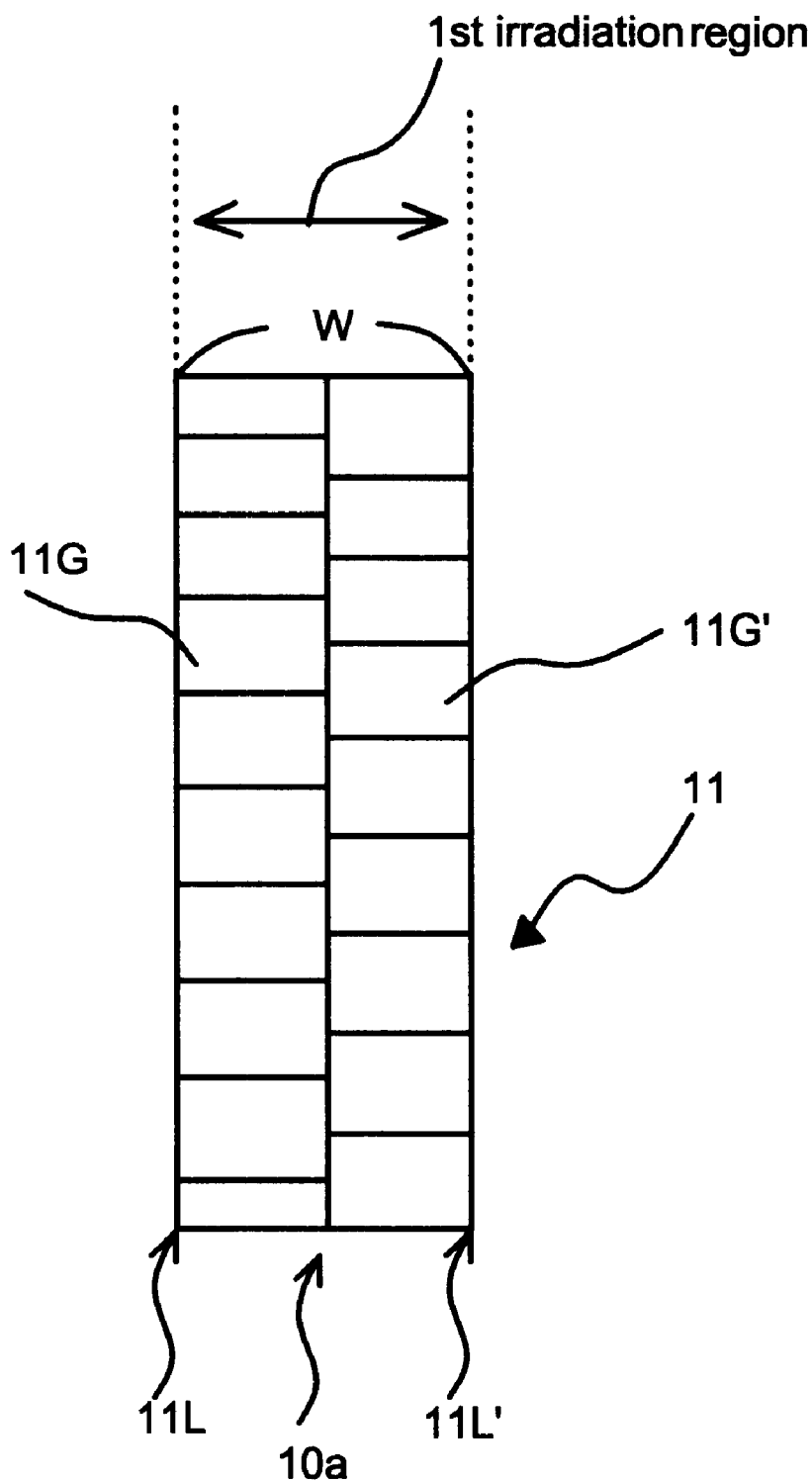

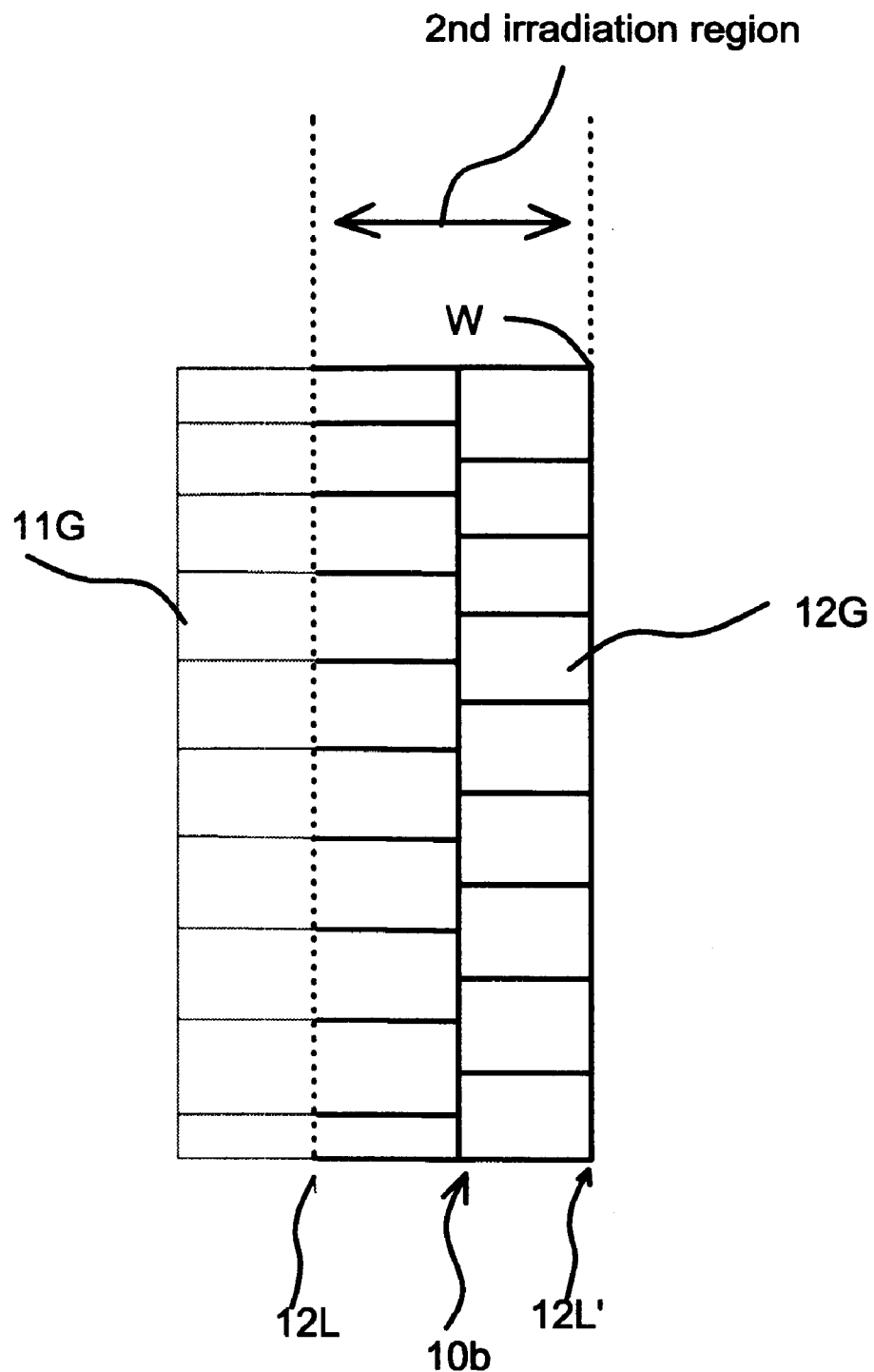

US 6,521,473 B1

METHOD OF FABRICATING A LIQUID CRYSTAL DISPLAY

This application claims the benefit of Korean Patent Application No. 1999-47533, filed on Oct. 29, 1999, which is hereby incorporated by reference.

BACKGROUND OF THE INVENTION

1. Field of the Invention

The present invention relates to a method of fabricating a liquid crystal display panel by patterning a silicon film that is crystallized by sequential lateral solidification.

2. Discussion of the Related Art

Using the fact that a silicon grain grows in a vertical direction at an interface between a liquid phase silicon region and a solid phase silicon region, sequential lateral solidification (hereinafter referred to as "SLS") is a technique of crystallizing an amorphous silicon film by enhancing the size of the silicon grain. SLS is achieved by growing the silicon grain laterally to a predetermined length by manipulating the displacement of the energy and irradiation range of a laser beam (Robert S. Sposilli, M. A. Crowder, and James S. Im, *Mat. Res. Soc. Symp. Proc.*, Vol. 452, 956957, 1997). Sequential lateral solidification can be applied to the field of laser crystallization.

Conventional silicon film crystallization using SLS is explained in accordance with the FIGS. 1A–4. In FIGS. 1A–1C, there is shown schematically the process of crystallizing an amorphous silicon layer by SLS, illustrating the respective growing states of silicon grains in accordance with the number n of laser irradiations.

Referring first to FIG. 1A, a bar-type laser beam (a laser beam with a cross-sectional shape in the shape of a bar) with a predetermined width is irradiated on amorphous silicon film 11. The laser is supplied with enough energy to melt the entire area of the amorphous silicon film that is irradiated by the laser beam (i.e., the first irradiation region). The irradiated area begins to solidify as soon as the laser beam melts it. During solidification, silicon grains 11G and 11G' grow laterally from interfaces 11L and 11L'. Interfaces 11L and 11L' are the boundaries between the section of the silicon film that is liquid as a result of irradiation by the laser beam (i.e., the first irradiation region) and the rest of the silicon film that is not irradiated by the laser beam and that remains solid. The growth length of the silicon grain by a single laser irradiation (or "laser pulse") depends on the thickness of a silicon film and the magnitude of laser energy. When a width W of the melted silicon section (i.e., the first irradiation region) is shorter than twice the growth length [of the silicon grain by one laser pulse], as shown in FIG. 1A, silicon grains 11G and 11G' stop growing as soon as they collide in the center of the melted silicon section. Grain boundary 10a is generated from the collision of the silicon grains 11G and 11G'.

On the other hand, the silicon grains stop growing when the width of the melted silicon section is longer than twice the growth length [of the silicon grain by one laser pulse]. This is because the silicon grains growing from both interfaces collide with micro-silicon grains generated from the central part of the melted silicon section as the melted silicon cools down.

Referring now to FIG. 1B, a second laser beam of predetermined width W is irradiated on the amorphous silicon film after the film has been moved a distance shorter than the growth length of the silicon grain by one laser pulse. The laser beam is supplied with enough energy to melt the entire silicon section that is irradiated by the laser beam (i.e., the second irradiation region). The second irradiation region melts and begins to solidify immediately as previously described. During solidification, silicon grains 11G and 12G grow laterally from interfaces 12L and 12L'. Silicon grain 11G, which is formed by the first laser beam irradiation, works as a seed for crystallization as it continues to grow laterally. Silicon grains 11G grow in the same direction of the dislocation of the laser beam. Grain boundary 10b is generated from the collision of silicon grains 11G and 12G grown laterally from interfaces 12L and 12L'.

Referring now to FIG. 1C, the desired length of silicon grain 11G is attained by repeating n times the silicon crystallization process comprising the steps of moving the amorphous silicon film (or the laser beam) by an amount no greater than twice the growth length, melting the silicon film by laser beam irradiation, and solidifying the melted silicon film. Silicon grain 11G grows laterally in the direction of laser scanning from the origin of formation.

SLS may be used to greatly increase the size of a silicon grain. When SLS is applied to a silicon film of large scale, silicon crystallization is achieved by applying a plurality of laser beams to the silicon film simultaneously to improve product yield.

FIG. 2 shows a mask for crystallizing a silicon film of large scale according to a related art technique. A mask may be used for patterning a single laser beam into a plurality of laser beams. Mask 20 has a plurality of bar-shaped, ray-penetrating regions 20-2. When mask 20 is used, a plurality of laser beams, the number and shapes of which are the same as regions 20-2, is provided.

FIG. 3 shows polycrystalline silicon film 30 of large scale formed by the related art technique. In FIG. 3, polycrystalline silicon film 30 is attained via SLS silicon crystallization using a plurality of bar-shaped laser beams that are provided by the mask shown in FIG. 2. Polycrystalline silicon film 30 comprises silicon grains G. Silicon grains G, which are grown along a first direction x, form grain boundaries 32 between the silicon grains. Boundary 31 is the boundary between the polycrystalline silicon regions formed by a single laser beam.

FIG. 4 shows the channel directions of thin film transistor (TFT) devices 41 and fabricated 42 using the method of fabricating an LCD panel from polycrystalline silicon film 30 according to the related art (i.e., growing silicon grains G in a direction horizontal to a substrate). Referring to FIG. 4, LCD devices comprising an LCD driver and an LCD pixel have channel directions that are horizontal x or perpendicular y to the substrate. Device 41, in which the channel direction is horizontal x, has the same characteristics as a single crystalline silicon device because device 41 contains only one grain boundary 32 to obstruct movement of charge carriers. On the other hand, numerous silicon grain boundaries 32 exist on the carrier paths in device 42 in which the channel direction is perpendicular to the substrate. The result is that the characteristics of device 42 are inferior to those of device 41 because device 42 is not a single crystalline device.

The electrical irregularity of devices fabricated using this method result in LCD panels with unreliable drivers and pixel parts. A need exists, therefore, for a method of fabricating an LCD panel that provides both a reliable driver TFT and a reliable pixel TFT.

SUMMARY OF THE INVENTION

Accordingly, the present invention is directed to a method of fabricating a liquid crystal display panel that substantially obviates one or more of the problems, limitations and disadvantages of the related art.

An object of the present invention is to provide a method of fabricating a liquid crystal display panel that provides a driver and a pixel part comprising TFT devices having improved and uniform electric characteristics.

Additional features and advantages of the invention will be set forth in the description that follows and, in part, will be apparent from the description or may be learned by practice of the invention. The objectives and other advantages of the invention will be realized and attained by the structure particularly pointed out in the written description and claims hereof, as well as the appended drawings.

To achieve these and other advantages, and in accordance with the purpose of the present invention as embodied and broadly described, the present invention provides a method of fabricating a liquid crystal display comprising the steps of preparing a silicon film, crystallizing the silicon film by growing silicon grains on a slant relative to the horizontal direction of the silicon film and forming TFT devices in which channels are arranged in a horizontal direction or a perpendicular direction with respect to the silicon film.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the present invention and which are incorporated in and constitute a part of this specification, illustrate embodiments of the present invention and together with the description serve to explain the principles of the present invention.

In the drawings:

FIGS. 1A–1C are schematic representations showing the process of crystallizing an amorphous silicon layer by SLS, illustrating the respective growing states of silicon grains in accordance with the number n of laser irradiations;

DETAILED DESCRIPTION OF THE PREFERRED EMBODIMENTS

In the present invention, a silicon film is crystallized using a modified SLS process wherein the modification involves growing silicon grains on a slant with respect to a substrate on which the film is formed. The process of the present invention crystallizes a silicon film having uniform grain boundaries in channel regions of respective TFT devices, thereby improving the quality of products such as liquid crystal displays by providing uniform electrical characteristics of TFT devices in both the driver and pixel portions of an LCD panel.

Reference will now be made in detail to the presently preferred embodiments of the present invention, examples of which are illustrated in the accompanying drawings.

Figure 5A:
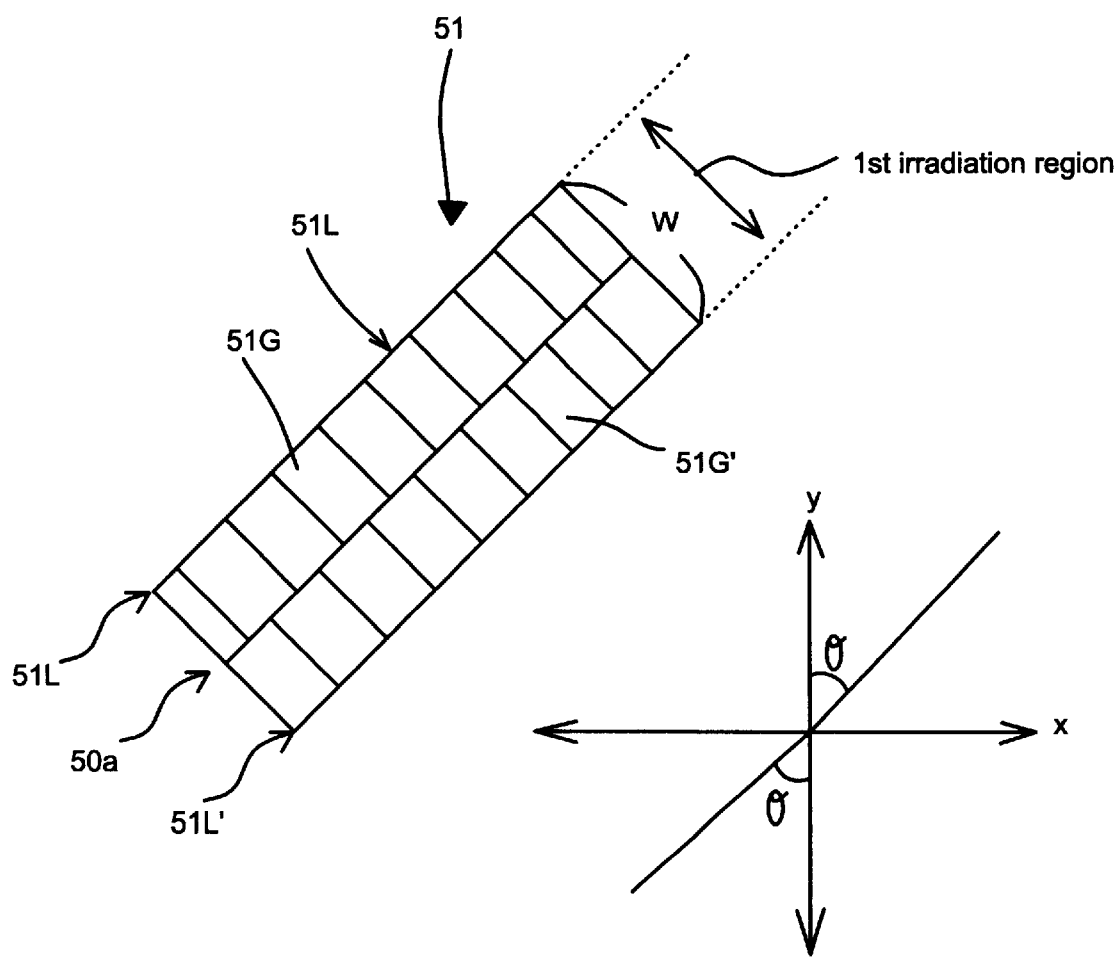
FIGS. 5A–5C are schematic drawings showing the process of crystallizing an amorphous silicon layer according to an embodiment of the present invention.

Referring first to FIG. 5A, amorphous silicon film 51 is irradiated by a first oblique laser beam (not shown) along the first irradiation region. Width W of the laser beam is predetermined such that the width W does not exceed the single-pulse silicon grain growth length. The laser beam is slanted at a predetermined angle θ relative to an axis y of a substrate on which the film is formed.

The laser is supplied with enough energy to melt the entire area of amorphous silicon film 51 that is irradiated by the laser beam (i.e., the first irradiation region). The first irradiation region, once exposed to the laser beam, begins to solidify as soon as it melts. During solidification, silicon grains 51G start to grow laterally from interfaces 51L and 51L'. Interfaces 51L and 51L' are the boundaries between the section of amorphous silicon film 51 that is liquid as a result of irradiation by the laser beam (i.e., the first irradiation region) and the rest of amorphous silicon film 51 not irradiated by the laser beam that remains solid.

When width W of the first irradiation region is shorter than twice the single-pulse growth length of the silicon grain, as shown in FIG. 5, silicon grains 51G growing from interfaces 51L and 51L' stop growing when they collide in the center of the first irradiation region. Grain boundary 50a is generated from the collision of silicon grains 51G and 51G'. On the other hand, when the width of the first irradiation region is longer than twice the growth length of the silicon grain by one laser pulse (not shown), the grains stop growing when the silicon grains growing from both interfaces collide with micro-silicon grains generated from the central part of the first irradiation region as it cools.

Figure 5B:
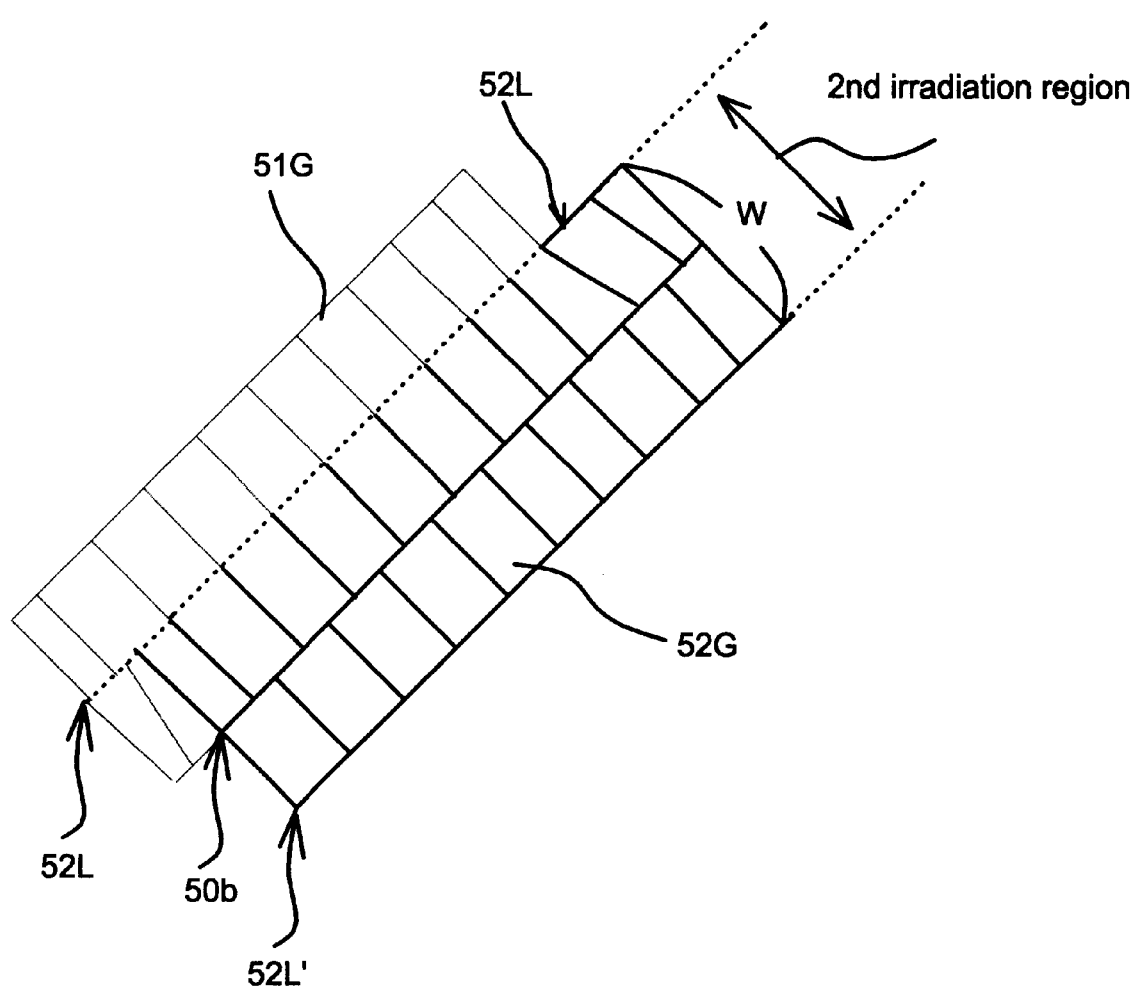

Referring now to FIG. 5B, a second laser beam (not shown) of predetermined width W is irradiated after amorphous silicon film 51 has been moved to a distance shorter than twice the single pulse growth length of the silicon grain. The second laser beam is at a slant with respect to amorphous silicon film 51. As is the case with conventional SLS, the laser beam is moved horizontally relative to the silicon film. Again, the laser beam is supplied with enough energy to melt the second irradiation region, which melts and solidifies immediately as explained in conjunction with FIG. 5A. During solidification, silicon grains 51G and 52G grow laterally from interfaces 52L and 52L'. Silicon grain 51G, which was formed by the first laser beam irradiation, works as a seed for crystallization as it continues to grow laterally after irradiation with the second laser beam. Silicon grains 51G and 52G grow in the direction of laser beam irradiation with a slant of a predetermined degree. Grain boundary 50b is generated from the collision of silicon grains 51G and 52G.

Figure 5C:
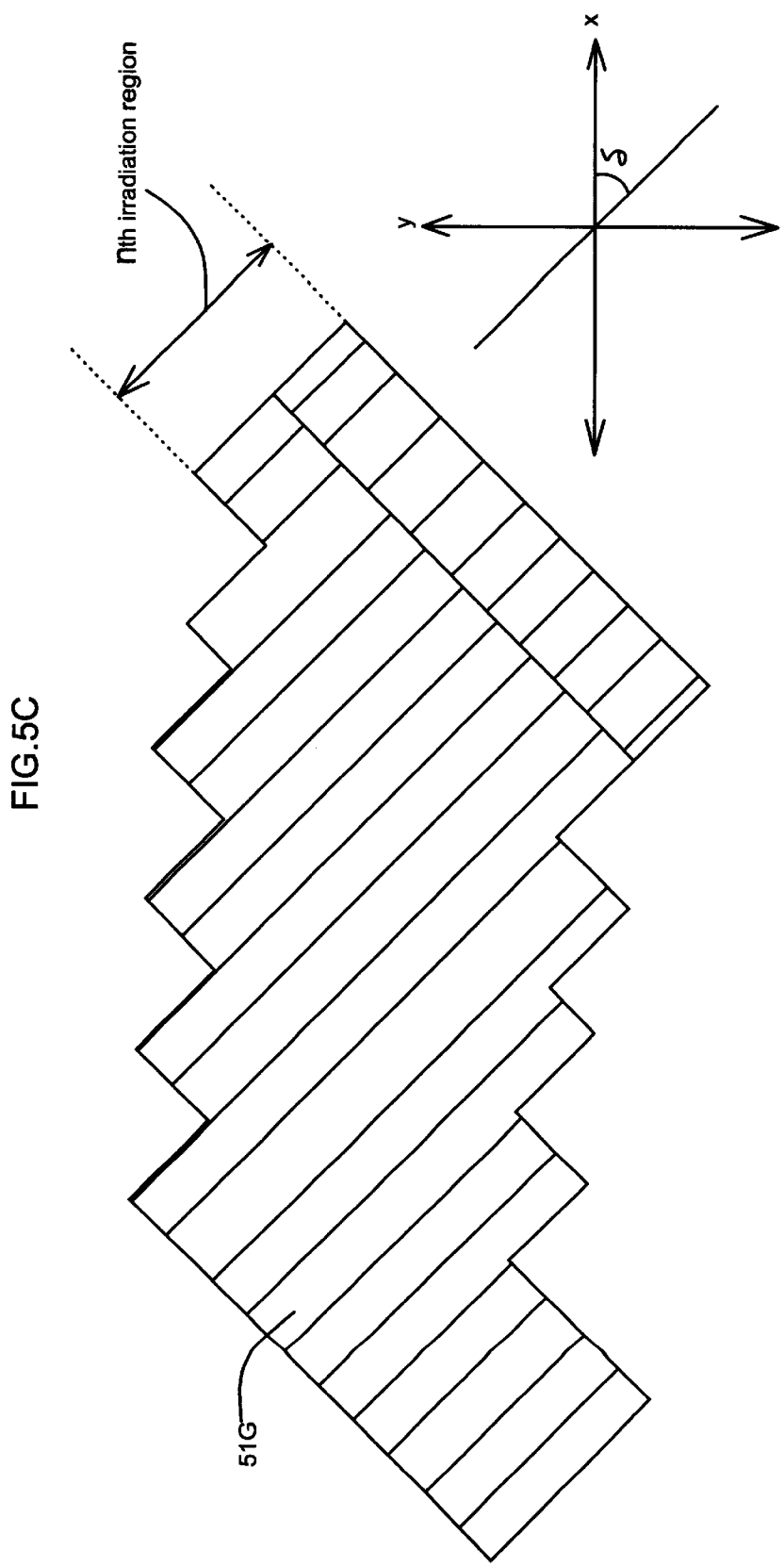

Referring now to FIG. 5C, the desired length of silicon grain 51G may be attained by repeating n times the silicon crystallization process of the present invention which comprises the steps of moving the amorphous silicon film (or the laser beam), melting the silicon film by laser beam irradiation, and solidifying the melted silicon film. Silicon grain 51G grows laterally to the direction of laser scanning from the origin of formation.

As a result of silicon crystallization according to the present invention, as silicon grain 51G grows laterally, it is slanted relative to a horizontal direction of the substrate at a predetermined angle. When devices such as TFTS are formed by patterning a polycrystalline silicon film formed in this manner, the uniformity of the devices may be secured because the number of grain boundaries in the devices is equal, provided that the devices are formed in the same direction relative to the substrate.

Figure 6:
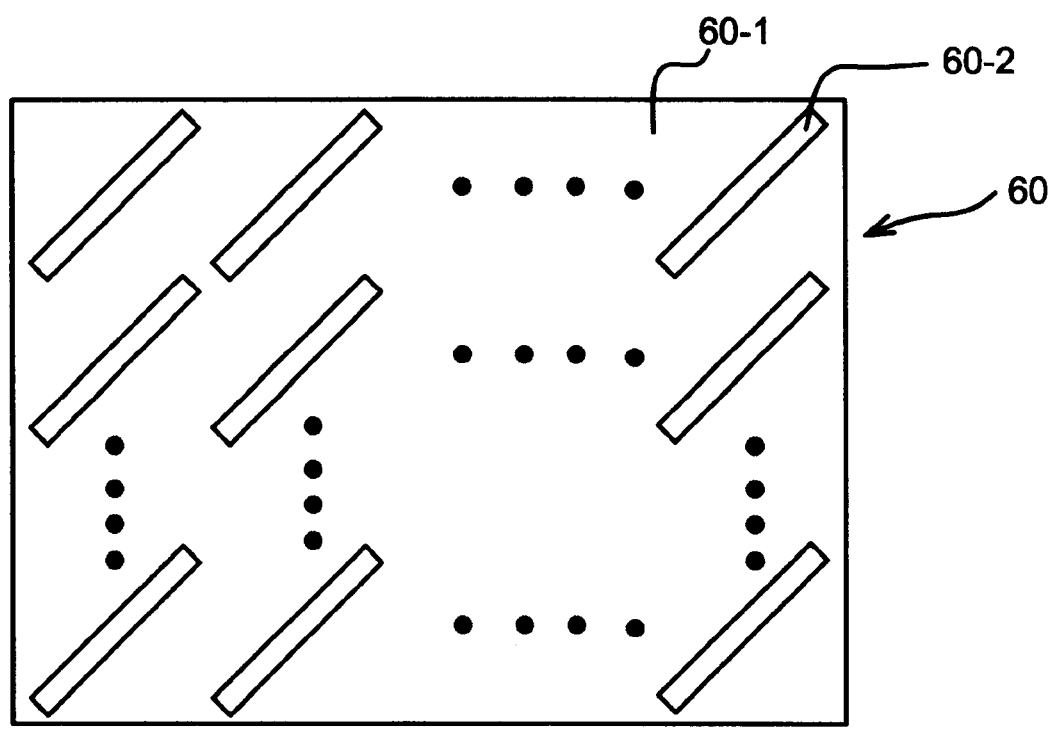
FIG. 6 shows a mask for crystallizing a silicon film according to an embodiment of the present invention.

FIG. 6 shows a mask 60 for crystallizing a silicon film according to an embodiment of the present invention. Mask 60 has a plurality of oblique ray-penetrating regions 60-2 slanted at a predetermined angle relative to the horizontal or perpendicular direction of ray-blocking region 60-1. By using mask 60, a plurality of laser beams, the number and shapes of which are the same as ray-penetrating regions 60-2, may be provided.

Figure 7:
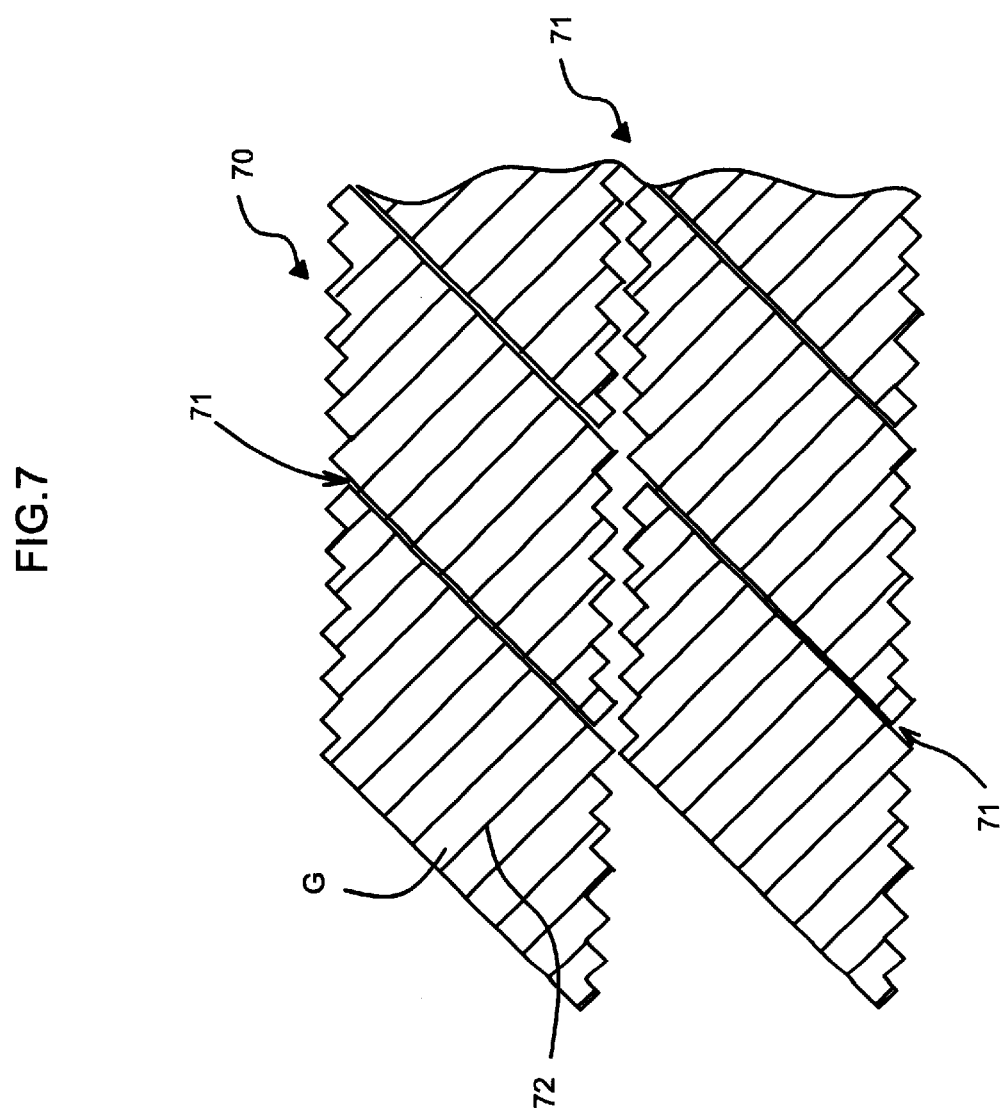
FIG. 7 shows a polycrystalline silicon film formed according to an embodiment of the present invention.

A polycrystalline silicon film according to the present invention, as seen in FIG. 7, is attained by silicon crystallization via SLS using a plurality of slanted laser beams as provided by mask 60. Silicon grains G grown on a slant relative to the horizontal direction x form grain boundaries 72 between the silicon grains comprising polycrystalline film 70. Boundary 71 is the boundary between the polycrystalline silicon regions formed by a single laser beam.

Figure 1C:
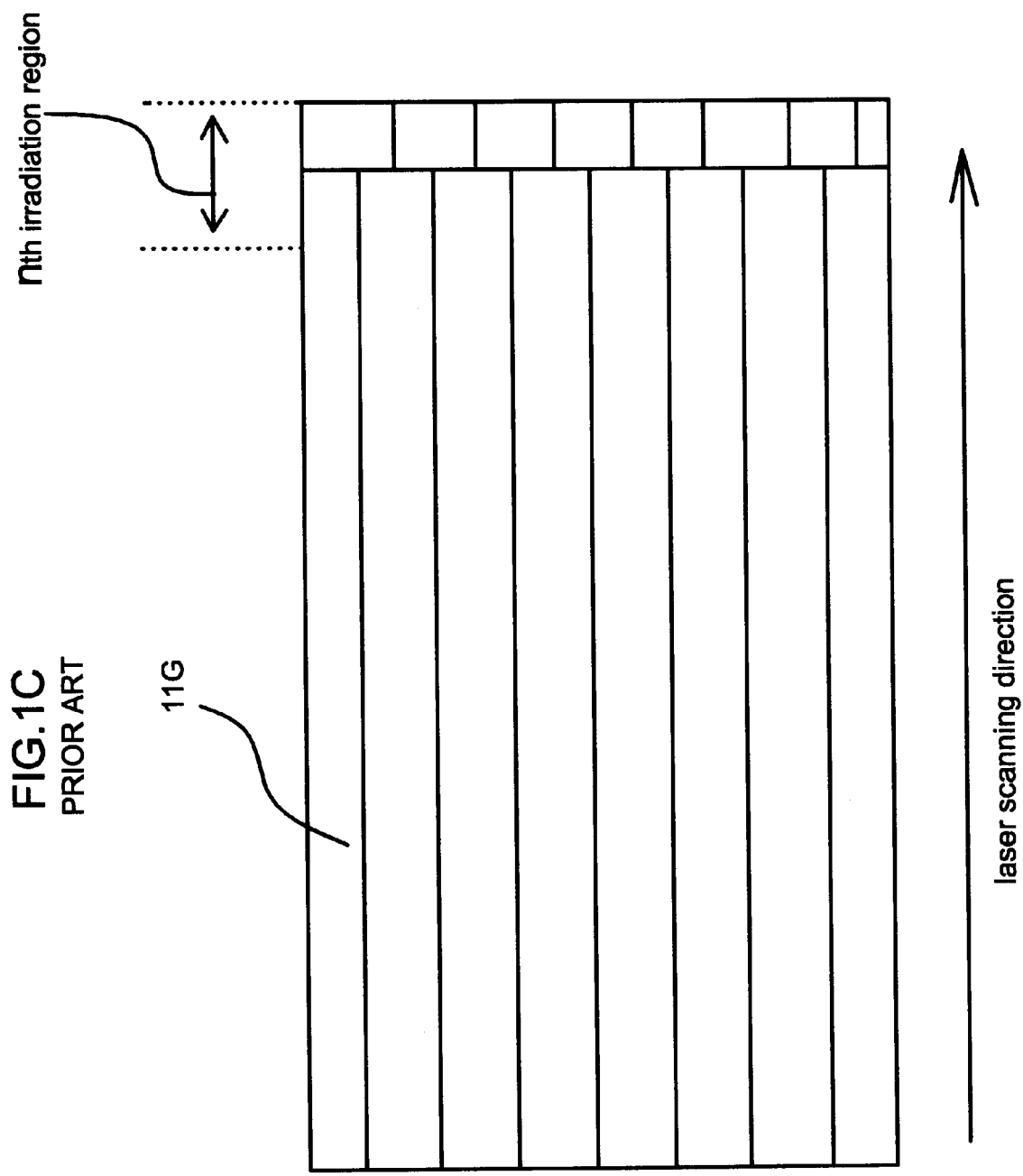
Figure 2:
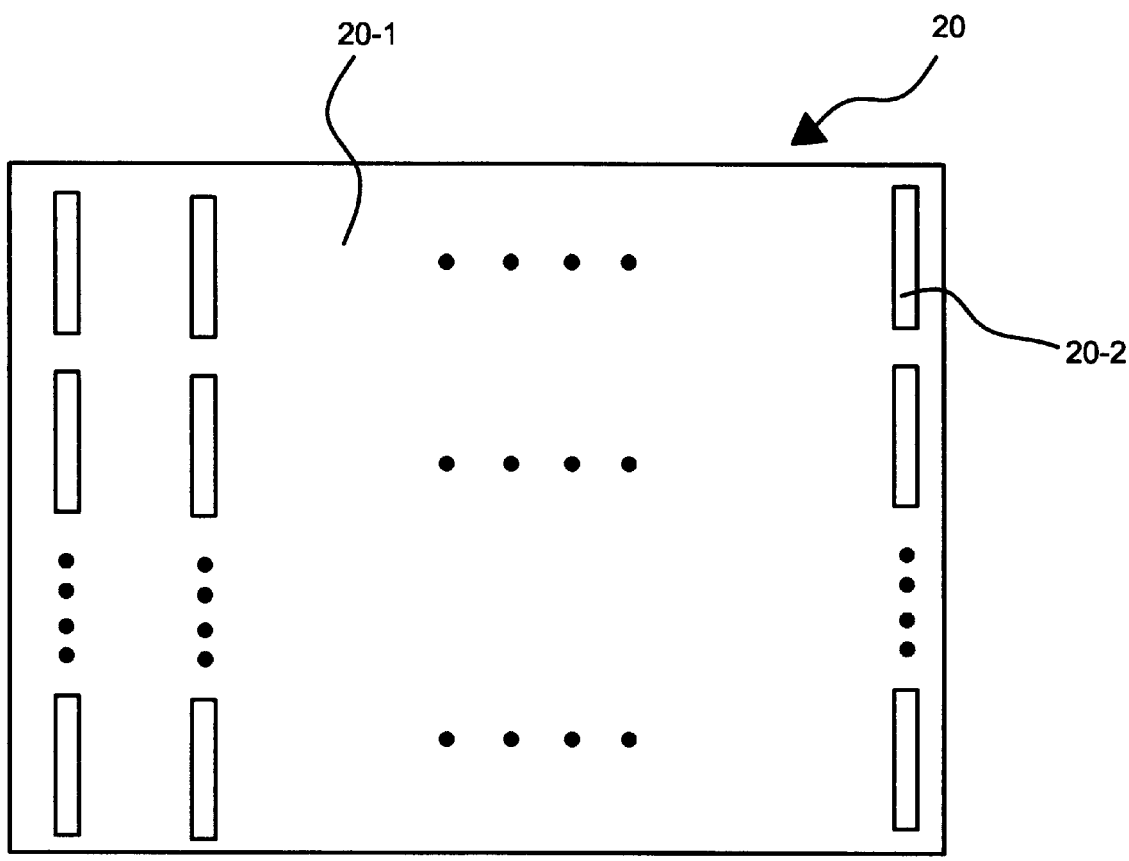
FIG. 2 shows a mask for crystallizing a silicon film of large scale according to the related art.
Figure 3:
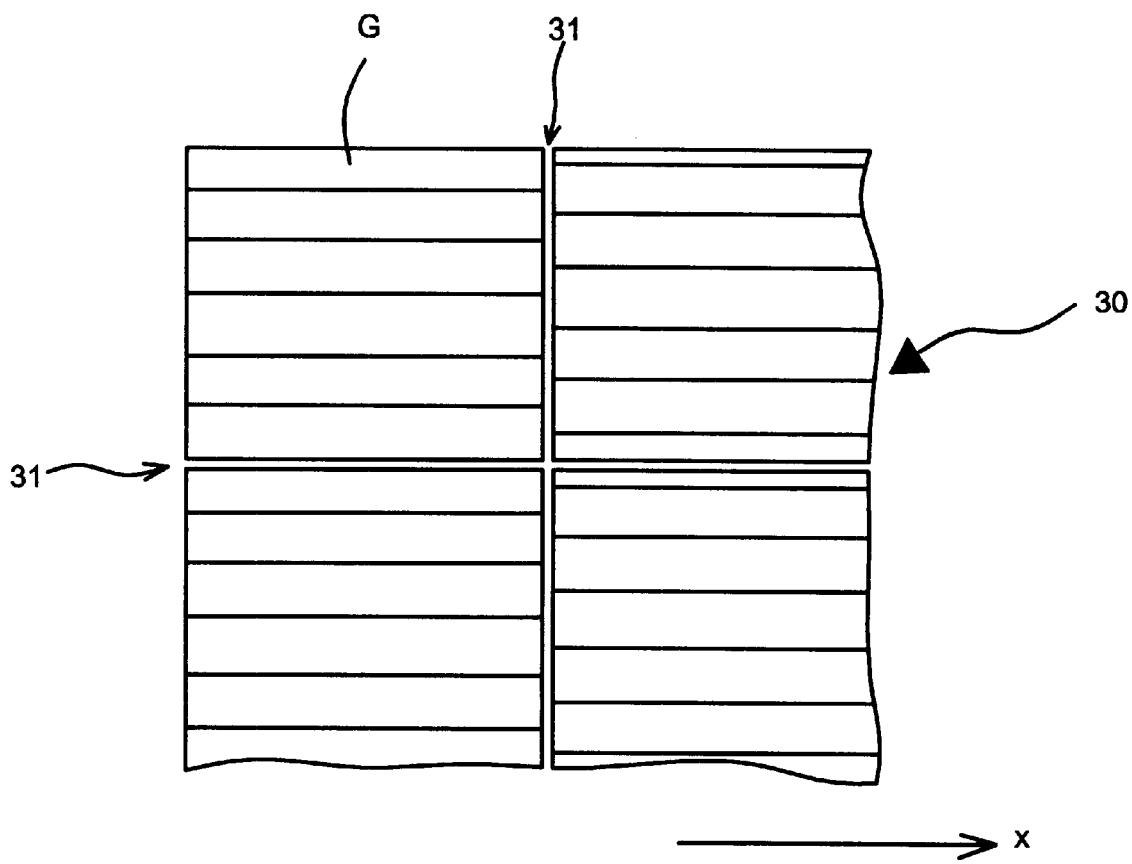
FIG. 3 shows a polycrystalline silicon film of large scale formed by the process of the related art.
Figure 4:
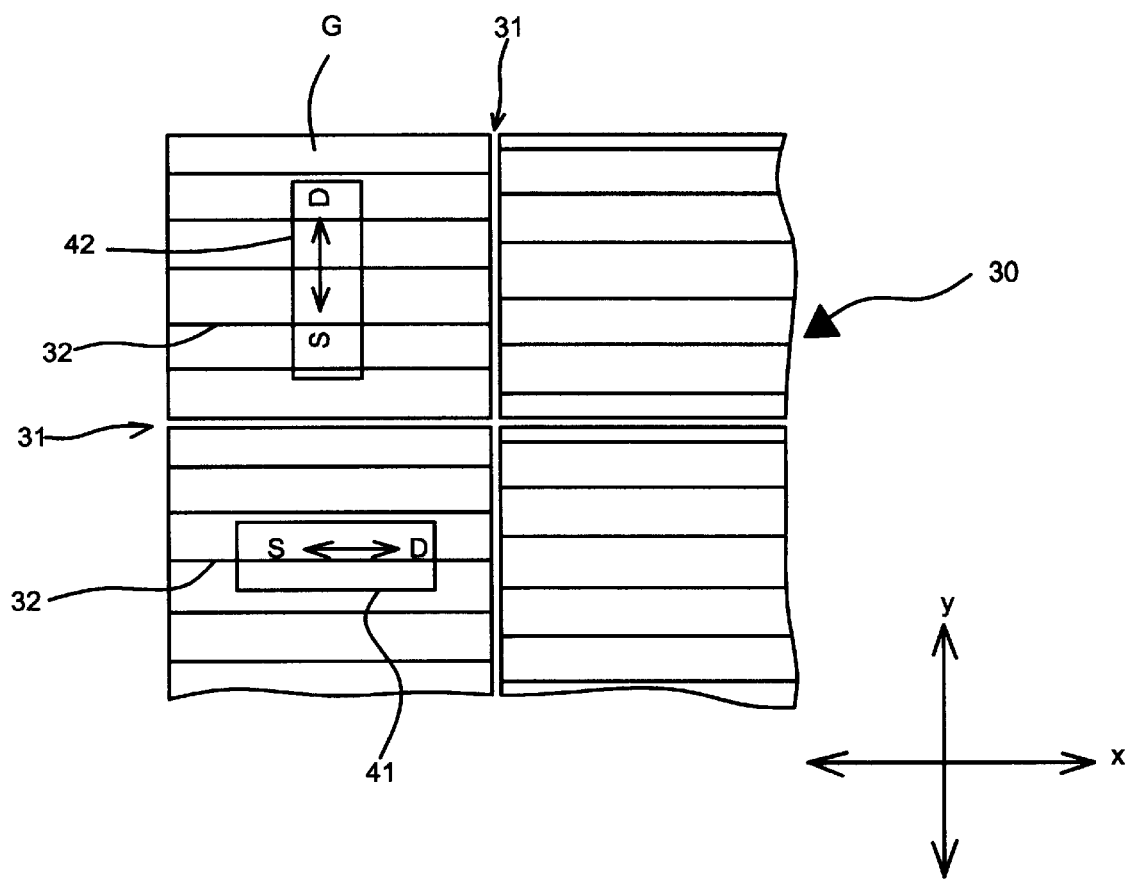
FIG. 4 illustrates the channel directions of devices in the method of fabricating an LCD panel according to the related art.

Polycrystalline silicon film 70 may also be formed by carrying out SLS after the mask used in the related art shown in FIG. 2 has been positioned at a slant at a predetermined angle. Namely, the oblique laser beam according to the embodiment of the present invention may be attained by arranging the mask, in which the bar-shaped ray-penetrating regions in the laser exposure system are formed, on a slant relative to the silicon substrate with a predetermined angle.

Figure 8:
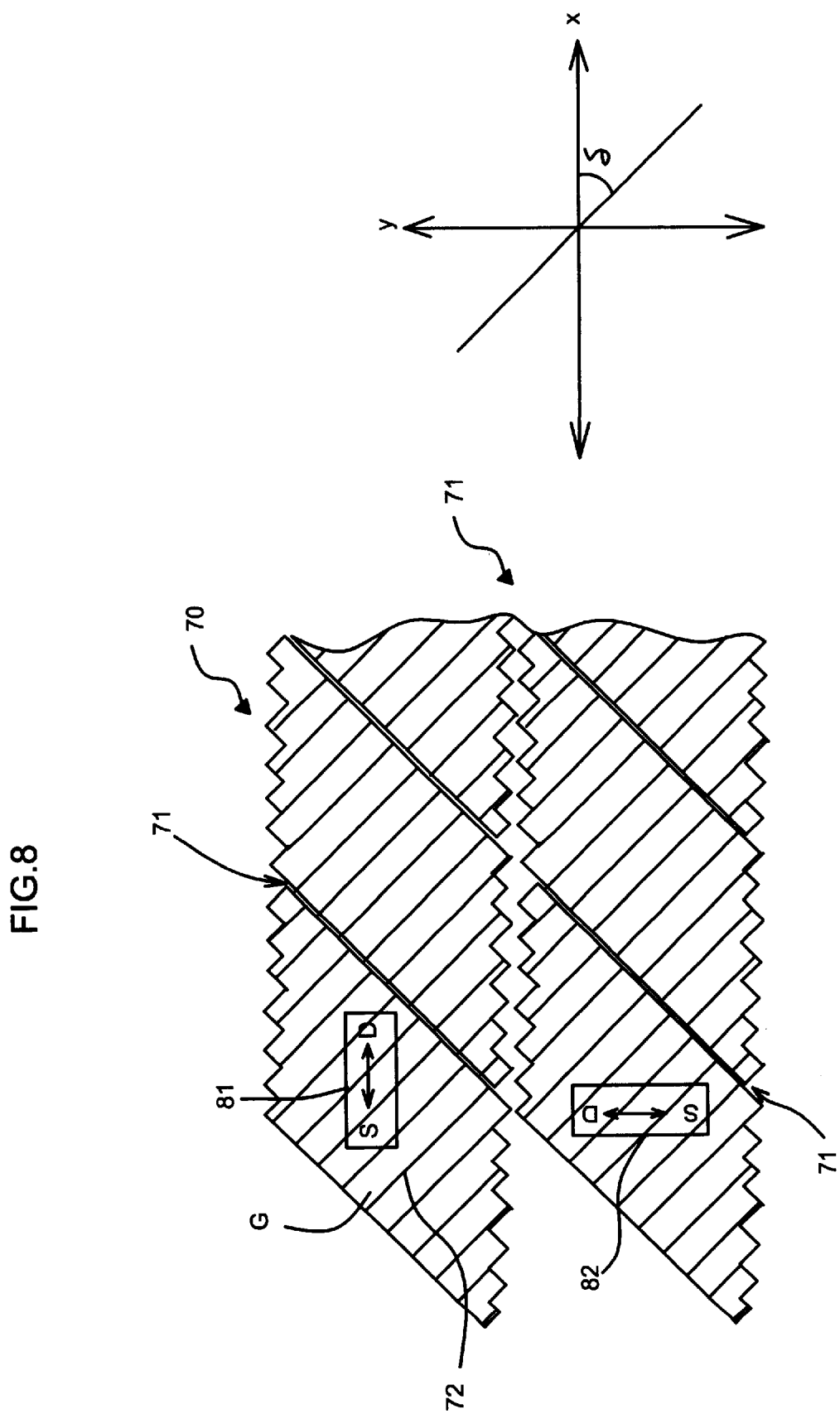
FIG. 8 shows a layout of a device arrangement according to an embodiment of the present invention.

FIG. 8 shows the channel directions of devices 81 and 82 when an LCD panel is fabricated with polycrystalline silicon film 70 in which silicon grains G are grown on a slant relative to the horizontal direction x of the substrate with a predetermined angle degree according to an embodiment of the present invention. Referring now to FIG. 8, devices 81 and 82, constituting part of an LCD driver, have channel directions that are horizontal or perpendicular to a substrate. The number of silicon grains of device 81, in which the channel direction is horizontal to the substrate is comparable to the number of silicon grains of device 82, in which the channel direction is perpendicular to the substrate. Particularly, when the growth direction of silicon grains is on a slant relative to the horizontal direction x of the substrate at an angle of about 45°, the number of grain boundaries inside device 81 is substantially equal to the number of grain boundaries inside device 82. The present invention, therefore, provides TFT devices that constitute the driver of the LCD panel such that the TFT devices have uniform carrier mobility among the devices, even though the TFT devices may be oriented at right angles to each other. This is also true of TFTs in the driver and TFTs in the pixel area when they are oriented in different directions.

It will be apparent to those skilled in the art that various modifications and variation can be made in the described embodiments of the present invention without departing from the spirit or scope of the invention. Thus, it is intended that the present invention cover the modifications and variations of this invention provided such modifications and variations come within the scope of the appended claims and their equivalents.

What is claimed is:

1. A method of fabricating a liquid crystal display, comprising the steps of:
   depositing a silicon film on a substrate;
   crystallizing the silicon film by growing silicon grains in a first direction;
   forming a plurality of transistors on the substrate, each of the transistors including a channel region, the channel region being formed from a portion of the silicon film;
   wherein at least one channel region is oriented perpendicularly to at least one other channel region and the first direction is on a slant with respect to the at least one channel region.

2. The method of claim 1, wherein the silicon film is crystallized by sequential lateral solidification.

3. The method of claim 2, wherein the sequential lateral solidification comprises irradiating the silicon film with at least one laser beam.

4. The method of claim 3, wherein a cross-sectional shape of the at least one laser beam is rectangular.

5. The method of claim 4, wherein the shape of the at least one laser beam is obtained using a mask having at least one rectangular ray-penetrating region.

6. The method of claim 5, wherein the at least one rectangular ray-penetrating region is parallel to an edge of the mask and the edge of the mask is on a slant with respect to the substrate.

7. The method of claim 5, wherein the at least one rectangular ray-penetrating region is slanted with respect to an edge of the mask.

8. The method of claim 4 further comprising the steps of:
   moving the at least one laser beam horizontally with respect to the silicon film; and
   irradiating the silicon film with a second laser beam.

9. The method of claim 4 further comprising the steps of:
   moving the silicon film horizontally with respect to the at least one laser beam; and
   irradiating the silicon film with a second laser beam.

10. The method of claim 4, wherein a width of the at least one laser beam is less than twice a single pulse growth length of silicon grains.

11. The method of claim 1, wherein the at least one channel region is in a pixel area and the other channel region is in a driver area.

12. The method of claim 1, wherein the at least one channel region and the other channel region are both in a driver area.

13. The method of claim 1, wherein an angle found by the first direction and an orientation of the at least one channel region is approximately 45 degrees.

14. A method of crystallizing a silicon film, comprising the step of growing silicon grains such that the silicon grains are slanted with respect to a horizontal direction of the silicon film.

* * * * *